(12) United States Patent
Feldotte et al.

(10) Patent No.: US 7,839,320 B2
(45) Date of Patent: Nov. 23, 2010

(54) MEASUREMENT AMPLIFICATION DEVICE AND METHOD

(75) Inventors: Heinrich Feldotte, Goettingen (DE); Alfred Klauer, Goettingen (DE)

(73) Assignee: Sartorius AG, Goettingen (DE)

( * ) Notice: Subject to any disclaimer, the term of this patent is extended or adjusted under 35 U.S.C. 154(b) by 22 days.

(21) Appl. No.: 12/430,209

(22) Filed: Apr. 27, 2009

(65) Prior Publication Data

US 2009/0206824 A1    Aug. 20, 2009

Related U.S. Application Data

(63) Continuation of application No. PCT/EP2007/009232, filed on Oct. 24, 2007.

(30) Foreign Application Priority Data

Oct. 27, 2006   (DE) ................ 10 2006 051 364

(51) Int. Cl.
*H03M 1/50* (2006.01)
(52) U.S. Cl. ............... 341/166; 341/118; 341/120; 341/143; 341/155; 341/172
(58) Field of Classification Search ......... 341/118–121, 341/143, 155, 166, 172
See application file for complete search history.

(56) References Cited

U.S. PATENT DOCUMENTS

| | | | |
|---|---|---|---|
| 4,268,820 A | 5/1981 | Hareyama | |
| 4,764,752 A | 8/1988 | Ormond | |
| 4,862,382 A | 8/1989 | Schneider et al. | |
| 5,148,171 A * | 9/1992 | Blumberg | 341/168 |
| 5,184,128 A * | 2/1993 | Snow | 341/128 |
| 5,229,772 A | 7/1993 | Hanlon | |
| 5,262,780 A | 11/1993 | Gray | |
| 5,327,137 A * | 7/1994 | Scheerer et al. | 341/168 |
| 5,519,352 A * | 5/1996 | Mo | 327/345 |
| 5,546,082 A * | 8/1996 | LaRocca et al. | 341/166 |
| 6,111,606 A * | 8/2000 | Ikeda | 348/241 |
| 6,243,034 B1 * | 6/2001 | Regier | 341/166 |
| 6,750,796 B1 * | 6/2004 | Holloway et al. | 341/143 |
| 6,906,648 B1 * | 6/2005 | Koike | 341/118 |
| 7,242,333 B1 * | 7/2007 | Wu | 341/122 |
| 7,248,200 B2 * | 7/2007 | Komuro et al. | 341/166 |
| 7,336,213 B2 * | 2/2008 | Gupta et al. | 341/166 |
| 7,626,529 B2 * | 12/2009 | Robert | 341/155 |
| 2005/0219105 A1 | 10/2005 | Liu et al. | |

FOREIGN PATENT DOCUMENTS

| | | |
|---|---|---|
| DE | 36 33 790 A1 | 4/1988 |
| DE | 694 24 931 T2 | 1/2001 |
| DE | 100 40 373 A1 | 2/2001 |
| EP | 0 680 151 B1 | 6/2000 |

* cited by examiner

*Primary Examiner*—Linh V Nguyen
(74) *Attorney, Agent, or Firm*—Sughrue Mion, PLLC

(57) ABSTRACT

Measurement amplification methods and devices for detecting a monopolar input signal ($U_E$) by integrating A/D conversion. Before being digitized, the input signal ($U_E$) is inverted according to the so-called Chopper principle and converted into a bipolar intermediate signal ($U_Z$). A reference voltage ($U_{ref}$) used in A/D conversion undergoes polarity changes synchronized with the polarity changes of the intermediate signal ($U_Z$). Offset and drift are eliminated by totaling an even number of individual measurements.

14 Claims, 3 Drawing Sheets

US 7,839,320 B2

1

MEASUREMENT AMPLIFICATION DEVICE AND METHOD

This is a Continuation of International Application PCT/EP2007/009232, with an international filing date of Oct. 24, 2007, which was published under PCT Article 21(2) in German, and the complete disclosure of which, including amendments, is incorporated into this application by reference.

FIELD AND BACKGROUND OF THE INVENTION

The invention relates to a measurement amplification device for detecting a monopolar input signal and for generating a digital output value as a measure for the input signal, which comprises a switchable inverter which is controlled by a clock pulse generator with a polarity-reversal clock pulse, the inverter converting the input signal into a bipolar intermediate signal with the polarity-reversal clock pulse, and an A/D converter which generates the digital output signal depending on the intermediate signal.

The invention also relates to a measurement amplification method for detecting a monopolar input signal and for generating a digital output value as a measure of the input signal, wherein the input signal is converted, by means of a switchable inverter which is controlled by a clock pulse generator with a polarity-reversal clock pulse into a bipolar intermediate signal with the polarity-reversal clock pulse, and the digital output signal is generated by means of an A/D converter depending on the intermediate signal.

DE 694 24 931 T1 discloses a device and a method of this type. Methods and devices of this type for digitizing detection of measurement signals are known in the field of chopper amplification and chopper conversion and these are described in greater detail below.

Before the introduction of the chopper principle, a DC signal to be measured (referenced herein, in general, as "input signal"), the actual origin of which is irrelevant to the present invention, was pre-amplified with a DC amplifier and then digitized in an A/D converter. An integrating A/D converter, for example, is suitable for the digitizing.

The principle of the integrating A/D converter has long been known in many variants, for example, from DE 21 14 141, DE 28 20 601 C2 and DE 100 40 373 A1. In an integrating A/D converter, the measured signal is applied to an input of an operational amplifier configured as an integrator. For configuring as an integrator, the output of the operational amplifier is linked via a capacitor to its measured signal input. Also linked to the measured signal input of the operational amplifier is the feed line for a DC reference signal. This reference signal is applied at a working level only at certain times. During the remainder of the time, it is applied at a quantitatively lower rest level or is completely disconnected from the input of the operational amplifier. During a first pulse portion of a measuring clock pulse, during which the working level of the reference signal is not applied, the capacitor is charged up by the measured signal amplified in the operational amplifier. If, after a predetermined time period, the working level of the reference signal is switched on, the capacitor discharges during a second clock pulse portion, so that the integrator output signal declines. The time point of a zero-crossing or, more generally, a threshold-crossing by the integrator output signal, is detected by means of a comparator connected downstream, which itself initiates, via control means, the disconnection of the working level of the reference signal from the integrator input, so that a new measuring clock pulse can begin with the charging of the capaci-

2 tor. The duration of the second clock pulse portion, that is, the time span during which the working level of the reference signal is applied to the integrator is measured with suitable time measuring means, for example, a clocked counter. The measured duration, referred to herein as the measured interval, represents a measure for the charging of the capacitor taking place in the first clock pulse portion, and therefore for the level of the measured signal. In the case of time measurement by means of a clocked counter, the counter value can be used directly as a digital measure of the measured signal.

In the past, a precise pre-amplification of the DC input signal presented difficulties due to the associated offset voltages and their drift. This was partially corrected by the introduction of the chopper principle which also brings advantages with regard to the suppression of 1/f noise.

When the chopper principle is used, the input signal is "chopped," i.e., it is transformed by means of an inverter into a bipolar intermediate signal. The intermediate signal is essentially a bipolar rectangular signal, the polarity of which changes with a polarity-reversal clock pulse. The polarity-reversal clock pulse is predetermined by a clock pulse generator, which is coupled via a suitable control signal to the inverter or is an integral component of the inverter itself. The bipolar intermediate signal can be pre-amplified with known AC amplifiers. The pre-amplified AC intermediate signal can then be converted back to a DC measured signal with in-phase rectification and subsequent low-pass filtration, wherein the rectifier is typically controlled by the same clock pulse generator in order to ensure synchronization of the inverting and subsequent rectifying processes. The subsequent digitizing of the resulting DC signal can then take place as described above by means of an integrating A/D converter.

As an alternative to in-phase rectification and subsequent low-pass filtration of the previously inverted signal, it is known to sample the bipolar inverter output signal directly and at high frequency, wherein the difference between the mean values of the sampled values detected in respective successive half-periods of the inverter output signal can be used as a measure of the signal to be determined. Compared with the previously described method of in-phase rectification and subsequent low-pass filtration, this method has the advantage of digital elimination of the offset and drift of the AC pre-amplification. However, it has the disadvantage of needing a very high frequency sampler, which has a limited resolution.

A sigma-delta ADC which is known from US 2005/0219105 A1, samples a monopolar input signal according to a specially provided clock pulse generator and transfers said signal in discrete intervals to a bipolar integrator operating as an analog low-pass filter. The polarity of the pre-sampled signal is switched over according to a fixed polarity-reversal clock pulse supplied by the clock pulse generator, in order to compensate for any mismatch in two parallel pre-sampling capacitors and any possible offset in the measured signal. The integrator output signal is converted in a downstream comparator, which operates as a 1-bit ADC, into a very high frequency digital pulse sequence which is fed to a reference signal switch operating as a 1-bit ADC. The reference signal switch changes the polarity of the reference signal that is also applied to the integrator according to the HIGH-level and/or LOW-level of the 1-bit signal, in order to achieve the negative feedback of the digital 1-bit signal with the input signal of the analog filter that is characteristic of sigma-delta conversion.

An ADC circuit is known from U.S. Pat. No. 5,229,772, wherein a monopolar input signal is likewise pre-sampled and transferred in discrete intervals together with the also pre-sampled reference signal to an integrator. In the context of the pre-sampling, in order to increase the charging level, the polarity of the measured signal and the reference signal, respectively, is switched over. However, only one polarity of the measured signal is applied, discontinuously, to the integrator. The polarity change in the measured signal and the reference signal is carried out using a separate clock pulse generator. The polarity of the reference signal is also reversed in order to create integration and de-integration phases in the manner described above, depending on the output signal of a comparator connected downstream of the integrator.

A device with voltage/frequency-conversion of a detuning signal of a measuring bridge is known from DE 36 33 790 A1, wherein according to the principle of alternating integration and de-integration of the detuning signal and comparison with a threshold value in a comparator, a pulse train which has a frequency that is representative of the bridge detuning is generated. In the known device, the polarity of the supply voltage of the measuring bridge is arbitrarily reversed according to an external polarity-reversal clock pulse. The detuning signal applied to the measuring bridge also changes its polarity accordingly, and this normally takes place during an integration phase, compared to the duration of which the duration of the de-integration phase is negligibly short. In order to avoid misplaced pulses occurring in the pulse train, a charge balance cycle which causes a delay of the pulse to be output is set in motion, and this also triggers the next de-integration phase.

OBJECT OF THE INVENTION

An object of the invention is to develop further measurement amplification devices and methods of the above-described type which enable good offset and drift reduction in pre-amplifiers without introducing additional high-frequency, but resolution-limited elements.

SUMMARY OF THE INVENTION

According to one formulation of the invention, this object is achieved in that the A/D converter comprises: an integrator for repetitive integration of the intermediate signal which is continuously applied to said integrator during operation and of a working level of a reference signal which is bipolar with the polarity-reversal clock pulse which is applied to the integrator intermittently, the reference signal originating from a reference voltage source controlled by the clock pulse generator, a comparator connected downstream of the integrator for comparing an integrator output signal with a threshold value, wherein a comparator output signal which depends on the comparison result is fed back, as a control signal for pre-determining the polarity-reversal clock pulse, to the inverter and the reference voltage source, and a time measurer for determining the durations of measured intervals during which the working level of the reference signal is applied to the integrator, as the basis of the measure for the input signal.

The above object is also achieved according to another formulation, in that, during operation, the intermediate signal is applied continuously, and a working level of a reference signal ($U_{ref}$) which is bipolar with the polarity-reversal clock pulse is applied intermittently, to an integrator of the A/D converter for repetitive integration, the reference signal originating from a reference voltage source controlled by the clock pulse generator, an integrator output signal is compared with a threshold value by a comparator connected downstream of the integrator, wherein a comparator output signal which depends on the comparison result is fed back, as a control signal for pre-determining the polarity-reversal clock pulse, to the inverter and the reference voltage source, and durations of measured intervals ($T_m$) during which the working level of the reference signal ($U_{ref}$) is applied to the integrator are determined as the basis of the measure for the input signal.

The underlying concept of the present invention is direct digitization of the possibly pre-amplified intermediate signal by respective adjustment of the reference signal to the polarity of the intermediate signal, which is determined by the state of the inverter. Over two successive integration phases, the capacitor of the integrator is charged in the reverse direction and then discharged again. As known from the prior art, the discharging time, that is, the period for which the working level of the reference signal is applied, is taken as a measure of the level of the intermediate signal and thus of the input signal.

An advantage of the present invention is the resulting lack of any need for rectification and low-pass filtration of the analog intermediate signal, that is, essentially the inverter output signal, which is required in the prior art. This saves components and does away with the associated sources of error. At the same time, "rectification" in the digital domain, that is, averaging and difference formation in the oversampled, bipolar digitized intermediate signal, which results in the above-described disadvantages, is also unnecessary. Rather, rectification occurs as a "natural" result of digitization with a bipolar reference signal.

Particularly preferred embodiments of the present invention are defined in the dependent claims.

Advantageously, the dependence of the intermediate signal and the reference signal on the comparator output signal is realized such that the comparator is configured to determine the time point of each crossing of the threshold value by the integrator output signal, in particular the zero-crossing, and a controller is provided for feedback of the comparator output signal, the controller controlling the switchable inverter, depending on the crossing time point determined, to cause a polarity reversal in the intermediate signal, and the switchable reference voltage source to disconnect the working level of the reference signal from the integrator. In other words, it is preferably provided that, when the integrator output signal is compared with a threshold value, in particular the zero value, the time point at which the integrator output signal crosses the threshold value is detected and the polarity change of the intermediate signal and the disconnection of the working level of the reference signal from the integrator is carried out depending on the detected time point. Typically, the control is configured so that the threshold-crossing or zero-crossing by the integrator output signal, the polarity change of the intermediate signal and the disconnection of the working level of the reference signal from the integrator input take place essentially simultaneously or synchronously with the pulses of a clocked counter used for time measurement. However, specific deviations from the clocked synchronism can be set. Comparable deviations in order to improve the convergence behavior of an A/D converter are known from DE 100 40 373 A1 which was cited above. The principles disclosed in that publication can easily be applied to the present invention.

In a particularly advantageous development of this embodiment of the invention, it is provided that the controller is also configured to control the switchable reference voltage source following a pre-determined time interval after each disconnection of the working level of the reference signal from the integrator for renewed application of the working level of the reference signal to the integrator. With regard to the inventive method, this means that the working level of the reference signal is applied again to the integrator, in each case, after a pre-determined time interval following disconnection of the working level of the reference signal from the integrator. In other words, this means that the time during which the reference signal is not applied or the rest level of the reference signal is applied to the integrator, and thus the time during which the capacitor of the integrator is charged, is essentially fixed. The integrator is therefore given a pre-determined charging time. By contrast, the discharging time of the capacitor, that is, the time during which the working level of the reference signal is applied, is variable and dependent on the quantity of integrated charge. This period, the measured interval, is ended by the comparator output signal and its duration is determined as a measure for the level of the intermediate signal. It should be noted that in this embodiment of the invention, in order to determine the measured interval, in practice the duration of the whole measuring clock pulse, that is, the duration of an integration phase and a de-integration phase which, in a preferred embodiment of the invention is equal to the duration between two polarity changes in the supply voltage, can be used as a measure of the intermediate signal and, therefrom, for the input signal, since only one constant time interval, specifically the duration of the charging phase of the capacitor, is added to the variable clock pulse portion, that is, the measured interval or the discharging phase of the capacitor.

Alternatively to the previously outlined variant with a variable measuring clock pulse, in another favorable embodiment of the invention, the measuring clock pulse can be kept constant. For this purpose, it is provided that the controller is also configured to control the switchable reference voltage source after a fixed time interval following, in each case, a preceding application of the working level of the reference signal to the integrator, for renewed application of the working level of the reference signal to the integrator. With regard to the inventive method, this means that the working level of the reference signal is applied anew to the integrator, in each case, after a fixed time interval following a preceding application of the reference signal to the integrator. In other words, the time period between two successive switching procedures for applying the working level of the reference signal to the integrator remains constant. However, the time period during which the working level of the reference signal remains applied to the integrator or the time during which the reference signal is not applied, or the rest level of the reference signal is applied, to the integrator is variable. The proportions of the charging and discharging phases within a fixed measuring clock pulse are therefore variable. It should be noted that, due to the simple dependency of the durations of the discharging phase and the charging phase on one another, in practice each of these phases is measured to determine the measured interval and can serve as the basis for a measure of the level of the intermediate signal and consequently for the input signal.

As mentioned above, when an AC pre-amplifier is used, offset and drift present a serious problem for the accuracy of the measurement of the input signal. The offset has the effect that during two successive measuring clock pulses with different polarity of the intermediate signal, different signal levels are applied to the integrator. Drift has the effect that an offset of this type cannot be eliminated by a single adjustment, since it changes over time, for example, due to temperature or moisture. However, this change occurs very slowly compared to the duration of the measuring clock pulses. To eliminate the time-variable offset, therefore, in a preferred development of the invention, adding means are provided for totaling an even number of measured interval durations, and output means are provided for outputting an output value based on the totaled value as a measure for the input signal. With regard to the inventive method, this means that an even number of successive measured interval durations are totaled and, based on the totaled value, a measure of the input signal is output. In this way, the respective offset is entirely eliminated.

At the same time, the totaling of the measured interval durations improves the resolution of the overall measurement. An independent measurement of an interval duration by means of a clocked counter is laden with an error of one clock pulse. It is therefore immediately clear that a continuous measurement which comprises an (even) number of interval durations and is also laden with an error of only one counter pulse, has a smaller relative error, that is, a better resolution. The resolution improvement also arises in the present case if an (even) number of sequential, separately measured interval durations are totaled. The reason for this lies therein that, due to the synchronous control of the reference signal, the durations of the capacitor charging intervals are not independent of the durations of the measured intervals between which they are embedded, that is, the rules of the error propagation theorem are not applicable. The resolution-improving effect of totaling an even number of measured interval durations therefore arises in each of the variants described above.

It is preferably provided that the adding means are configured to base a current determination of the totaled value on the sequence of measured interval durations on which a preceding determination was based, without a pre-determined number of durations of the oldest measured intervals and additionally with the same number of durations of the newest measured intervals that were not taken into account in the preceding determination. With regard to the inventive method, this means that a current determination of the totaled value is based on the sequence of measured interval durations on which a preceding determination was based, without a pre-determined number of durations of the oldest measured intervals and additionally with the same number of durations of the newest measured intervals that were not taken into account in the preceding determination. In other words the sequence of measured intervals, the durations of which are each totaled to determine an offset-free measure of the input signal, is determined in the manner of a "moving window." If, for example, the measured interval durations measured at time points $t1$, $t2$, $t3$ and $t4$ (where $t1<t2<t3<t4$) are added to determine the totaled measured interval duration, on a subsequent determination, the durations measured at time points $t2$, $t3$, $t4$ and $t5$ (where $t2<t3<t4<t5$) can be added. This means that, following each determination of a measured interval duration, an updated measure of the input signal can be output, wherein each current output value gains from the offset-freedom and the high resolution resulting from the addition. In this example, the "moving window" is displaced by one measured interval each time. Naturally, other step sizes are also possible for the displacement.

It should also be noted that there is a danger that, due to the inventive re-poling of the intermediate and reference signals, an additional error source can arise. The error thereby introduced grows with the frequency of the re-poling. In one variant of the invention, it can therefore be provided that the reversal of polarity in the intermediate signal and thus also in the reference voltage is not activated with every clock pulse, but only on every $n^{th}$ measuring clock pulse, that is, after every $n^{th}$ measured interval, where n preferably lies between 2 and 100, in particular between 2 and 10. The actual choice of n is made by considering the error incurred by the switching frequency and the increased reaction inertia when n is made larger. For the elimination of the offset by addition, in this variant, it is necessary to total an even multiple of n measured interval durations. By contrast, in this variant, the choice of step size is not limited in the case where a moving window is used.

BRIEF DESCRIPTION OF THE DRAWINGS

Further features and advantages will now be described by reference to exemplary embodiments and the drawings, in which.

DETAILED DESCRIPTION OF PREFERRED EMBODIMENTS

Figure 1:
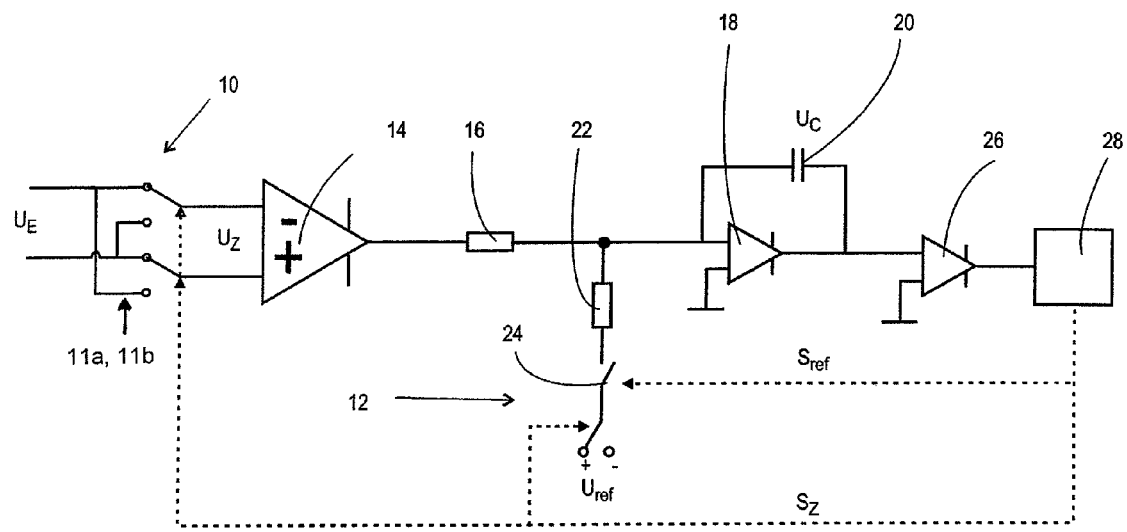
FIG. 1 is a schematic equivalent circuit diagram of an embodiment of the present invention.

FIG. 1 shows a schematic equivalent circuit diagram of a device according to the present invention. On the left side of FIG. 1, an inverter circuit 10 with two simultaneously switchable switches 11a and 11b is shown, which converts an input signal $U_E$ applied to the input of the inverter 10, that is a monopolar voltage which is to be measured, into an essentially rectangular, bipolar intermediate signal $U_Z$. The conversion takes place at the clock rate of the switching of the inverter 10, which itself is set by a control signal $S_Z$ applied to a control input of the inverter 10. This clock pulse is herein designated the polarity-reversal clock pulse.

Figure 2:
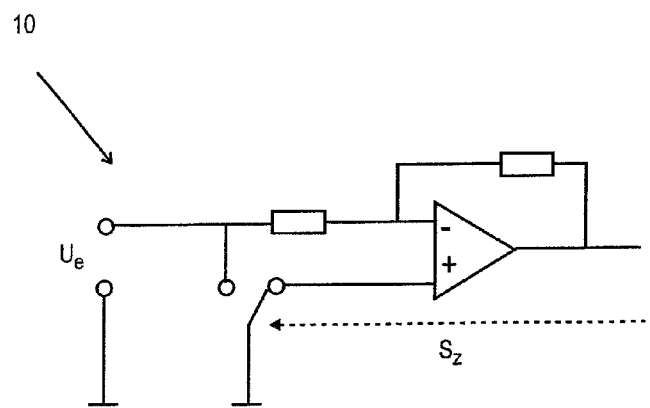
FIG. 2 shows an alternative embodiment of the inverter of FIG. 1.

FIG. 2 shows an alternative embodiment of the inverter 10, which has only one switch to be controlled, but requires an additional operational amplifier.

The actual design of the inverter 10 is not relevant to the present invention and can be selected by a person skilled in the art depending on the particular requirements of the actual application. The origin of the input signal $U_E$ is also not essential to the present invention.

The intermediate signal $U_Z$ resulting from the inversion is suitably pre-amplified by an AC pre-amplifier 14 in the embodiment according to FIG. 1. The pre-amplifier 14 is typically subject to offset and drift, so that errors needing to be corrected typically enter into the measurement at this point.

The output voltage of the pre-amplifier 14 is converted via a resistor 16 into a corresponding current, which is applied to a first input of an operational amplifier 18 which is configured as an integrator. The second input of the operational amplifier 18 is connected to earth in the present example, although any other constant potential could, in principle, be applied. The configuration of the operational amplifier 18 as an integrator is realized with the feedback of its output signal to its first input via the integrating capacitor 20, across which the capacitor voltage $U_C$ exists.

Also applied to the first input of the operational amplifier 18 is a reference voltage $U_{ref}$ which is converted, via the resistor 22, into a current. The reference voltage $U_{ref}$ is supplied by a switchable reference voltage source 12, which is synchronized by suitable means with the inverter 12. In the embodiment shown in FIG. 1, this is particularly advantageously achieved in that a switchable DC voltage source together with an additional switch 24 is used as the reference voltage source 12, wherein the switchable DC voltage source is controlled by the same control signal $S_Z$ as the inverter 10. By this means, it is ensured that the reference voltage $U_{ref}$ is subject to a polarity change with the polarity-reversal clock pulse, that is, always simultaneously with the intermediate signal $U_Z$, wherein however, due to the additional switch 24, an additional clock rate can be imposed. The switch 24 is controlled by its own control signal $S_{ref}$. It should be noted that in the embodiment shown, the reference voltage $U_{ref}$ is either applied to the input of the operational amplifier or is disconnected therefrom. In other conceivable embodiments, in place of the disconnection, application of a quantitatively lower rest level can be provided.

Connected downstream of the integrator consisting of the operational amplifier 18 and the capacitor 20 is a comparator 26, which in the embodiment shown is configured as a difference amplifier connected to earth. In other embodiments, the comparator can also be connected to a potential different from earth. The time points of zero-crossing by the integrator output voltage can be determined by the comparator. A controller 28 connected downstream of the comparator 26 processes the comparator output signal to generate the control signals $S_Z$ and $S_{ref}$ for controlling the inverter 10 or the reference voltage source 12. The controller 28 is merely shown as a function block in FIG. 1 and can be realized in different ways, either purely as hardware or as a combination of hardware and software. Their method of operation will now be described for two particularly preferred embodiments of the invention, by reference to the timing diagrams in FIGS. 3 and 4.

Figure 3:
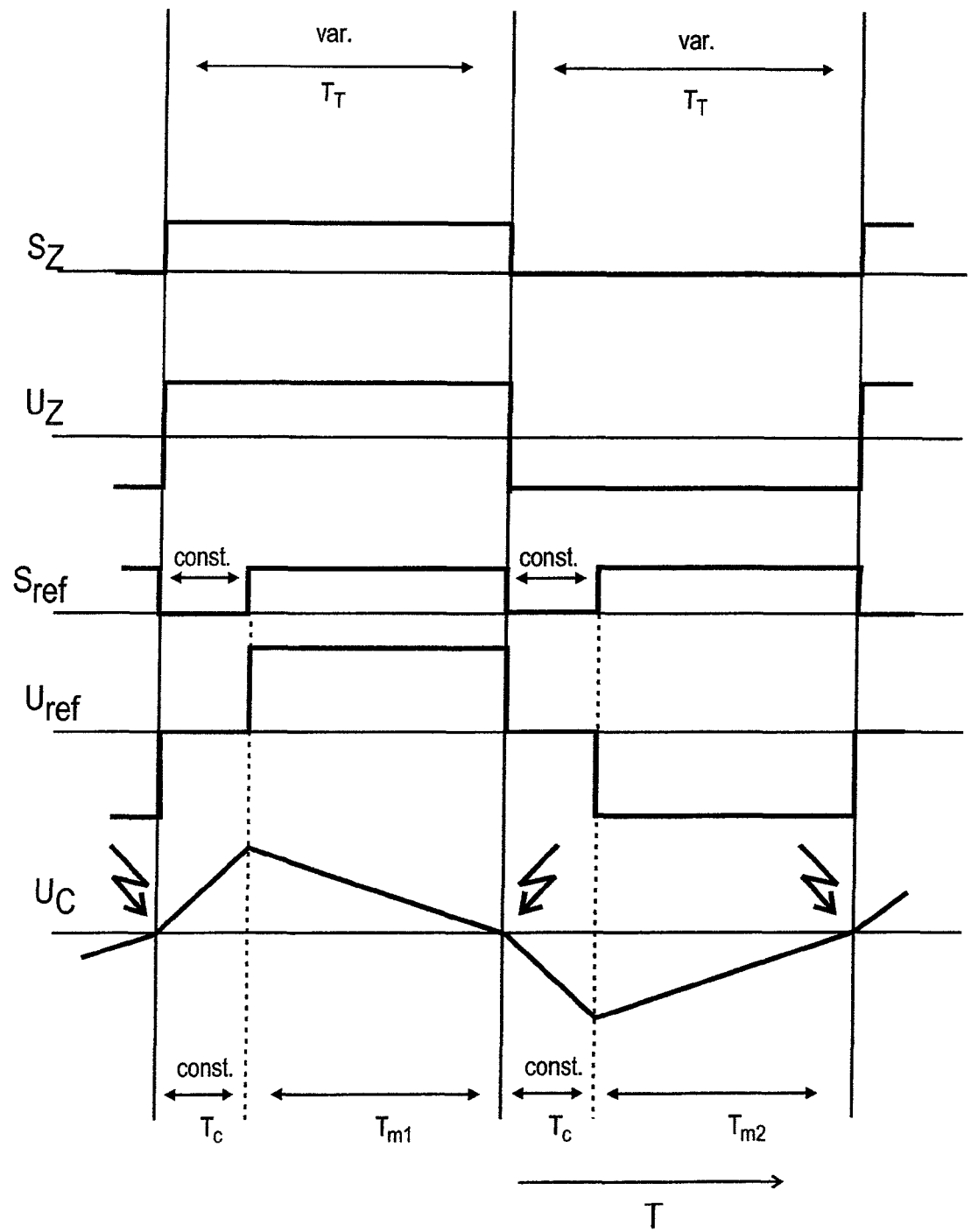
FIG. 3 is a schematic timing diagram of a first embodiment of the present invention.

FIG. 3 shows a timing diagram according to a first embodiment of the present invention. The diagram is intended merely to illustrate the relative, temporal relationships between the individual signals, wherein the representation involves arbitrary units. As stated above, the bipolar intermediate signal $U_Z$ follows the control signal $S_Z$ which, in the embodiment illustrated, is a monopolar signal, but naturally could also be configured, for example, bipolar and/or as a pulse signal. Of essential importance is that the polarity changes in the intermediate signal $U_Z$ and the reference voltage $U_{ref}$ take place according to the control signal $S_S$. In order to simplify the representation, the output signal of the inverting pre-amplifier 14, which can possibly show an offset which changes over time relative to the intermediate signal $U_Z$, is not shown in FIG. 3. It should be noted that the inverting nature of the pre-amplifier 14 is not relevant to the invention, but is dependent on the constellation of the potentials applied to different points in the circuit. Of importance is only that the pre-amplified intermediate signal has a different polarity from the reference signal.

As previously stated, the reference voltage $U_{ref}$ undergoes essentially the same polarity changes as the intermediate signal $U_Z$. Added to this are the clock pulses from the control signal $S_{ref}$. In the embodiment according to FIG. 3, the reference voltage $U_{ref}$ is disconnected from the input of the integrator 18, 20 at the beginning of each measuring clock pulse. During this time, only the inverting pre-amplified intermediate signal $U_Z$ is applied to the input of the operational amplifier 18. During this first clock pulse portion $T_C$ of the measuring clock pulse $T_T$, the capacitor 20 charges up, which leads to a (quantitative) rise in the capacitor voltage $U_C$. After the pre-determined period $T_C$, which in the embodiment of FIG. 3 is constant, the reference voltage $U_{ref}$ is additionally applied to the input of the integrator 18, 20 by switching over the switch 24 depending on the control signal $S_{ref}$. Due to its polarity, which is reversed relative to the intermediate signal $U_Z$, during the subsequent pulse portion $T_m$, the capacitor 20 discharges and does so until the capacitor voltage $U_C$ undergoes a zero-crossing, which is registered by the comparator 26. These time points are indicated with lightning arrows in FIG. 3. The time point of the zero-crossing is translated by the controller 28 into a synchronous change in the control signals $S_Z$ and $S_{ref}$, so that the polarity of the intermediate signal $U_Z$ and the reference voltage $U_{ref}$ changes and the reference voltage $U_{ref}$ is also disconnected from the input of the integrator 18, 20. The subsequent measuring clock pulse takes place in the same manner as described above, but with reversed polarities.

The level of the intermediate signal $U_Z$ is represented by the time interval that is necessary in order to discharge the capacitor 20 after a constant charging time $T_C$, that is, until zero-crossing by $U_C$. This interval is the measured interval $T_m$. Since, as mentioned, the charging time $T_C$ is constant, both the duration of the measured interval $T_m$ and the duration of the overall measuring clock pulse $T_T = T_C + T_m$ can be determined as a measure for the level of the intermediate signal $U_Z$. Detection of the duration of $T_m$ or $T_T = T_C + T_m$ is preferably carried out by means of a high-frequency counter which starts preferably at the start of $T_C$ or $T_m$, preferably dependent on $S_{ref}$ and/or $S_Z$. Detection of the different interval durations can be performed with a single counter.

As mentioned, an offset can be introduced into the intermediate signal $U_Z$ by the pre-amplifier 14. This would mean that the intervals of different polarity would supply different levels of the intermediate signal $U_Z$. This would have the consequence that two successive measuring clock pulses of different polarity would have different durations, wherein the duration of one measuring clock pulse would be too long by the same amount as the duration of the other measuring clock pulse would be too short. Through addition of two or, more generally, an even numbered plurality of measured interval durations or measuring clock pulse durations, this error can therefore be corrected, so that the totaled value is an accurate measure for the input signal $U_E$. It should be noted that this correction is independent of any drift of the offset over time, provided the drift is slow compared with the totaled overall duration. Due to the constancy of the charging-up period $T_C$, both successive measuring intervals $T_{m1}$ and $T_{m2}$ and the durations of two successive complete measuring clock pulses $(T_C + T_{m1}) + (T_C + T_{m2})$ can be used. As a result, as mentioned before, the resolution of the digitization can be improved. Rapid updating of the output measure for the input signal $U_E$ can be achieved by selecting the measured interval durations to be totaled as per the "moving window" method explained above.

Figure 4:
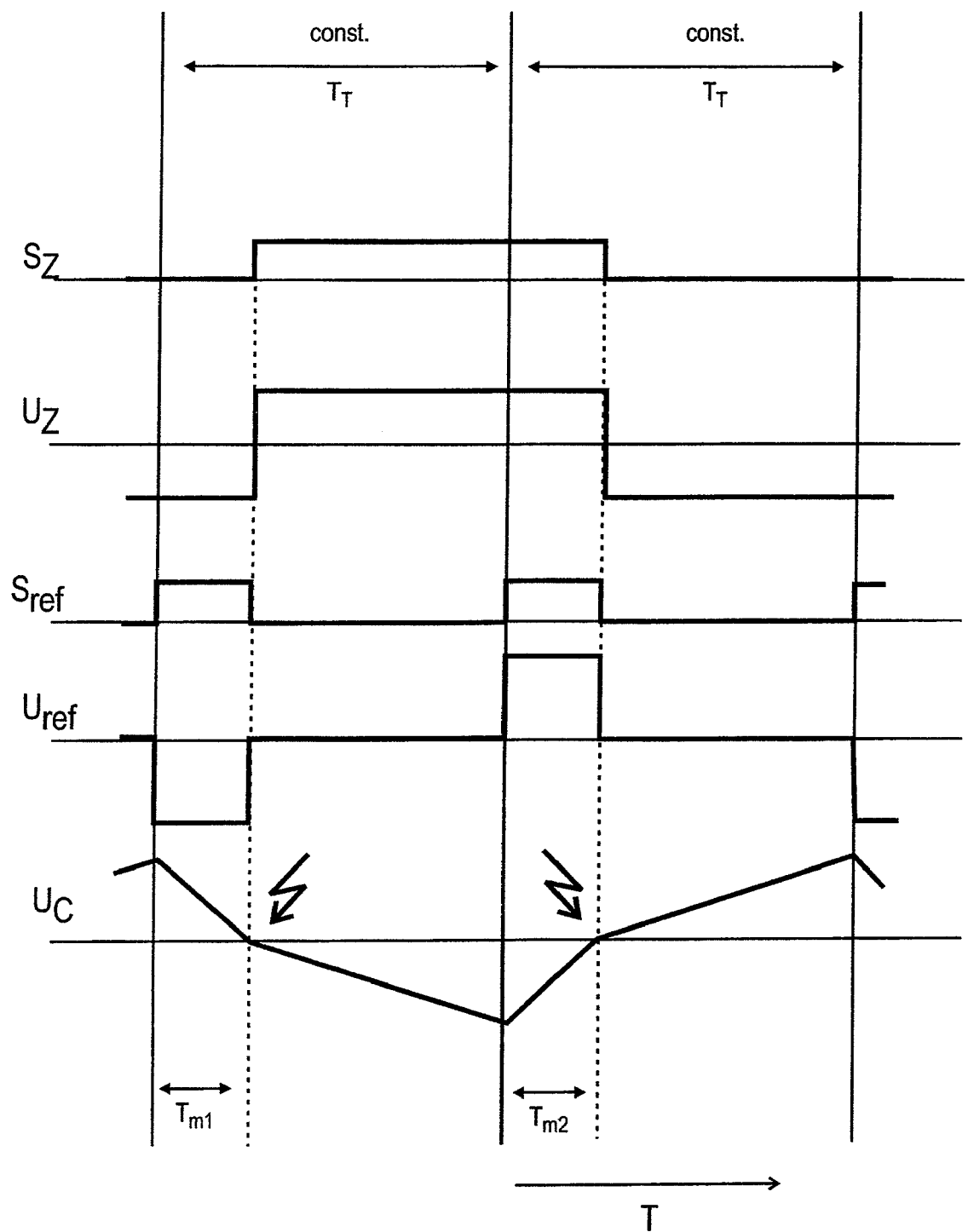
FIG. 4 is a schematic timing diagram of a second embodiment of the present invention.

FIG. 4 shows a schematic timing diagram of a second embodiment of the present invention for which the statement made above regarding FIG. 3 also applies. As distinct from the embodiment according to FIG. 3, the overall duration of each measuring clock pulse $T_T$ is constant in FIG. 4. Only the relative proportions of the charging phase and the actual measured interval $T_m$, that is, again, the time that is needed to discharge the charged-up capacitor by additional application of the reference voltage $U_{ref}$, are available.

The timing diagram of FIG. 4 is otherwise to be interpreted as described for FIG. 3. It should be noted that the different gradients of the individual sections of $U_C$ are a result of the relative levels of the (possibly pre-amplified) intermediate signal $U_Z$ and the reference voltage $U_{ref}$.

The embodiments shown in the drawings and explained in the detailed description are of course only intended as illustrative examples of the present invention. In light of the disclosure herein, a broad spectrum of possible variations is open to a person skilled in the art. In particular, slight deviations can be made from the strict synchronization of the individual switchable signals, for example, in order to achieve rapid convergence of the digitized signal in the event of severe level variations in the input signal $U_E$. The applicant seeks to cover all such changes and modifications as fall within the spirit and scope of the invention, as defined by the appended claims, and equivalents thereof.

What is claimed is:

1. A measurement amplification device for detecting a monopolar input signal ($U_E$) and for generating a digital output value as a measure for the input signal ($U_E$), comprising:
    a switchable inverter which is controlled by a clock pulse generator with a polarity-reversal clock pulse, said inverter converting the input signal ($U_E$) into a bipolar intermediate signal ($U_Z$) with the polarity-reversal clock pulse, and
    an A/D converter which generates the digital output value depending on the intermediate signal, wherein the A/D converter comprises:
        an integrator which repetitively integrates (a) the intermediate signal ($U_Z$), which is continuously applied to said integrator during operation, and (b) a working level of a bipolar reference signal ($U_{ref}$), which is applied to said integrator intermittently, the reference signal ($U_{ref}$) originating from a switchable reference voltage source controlled by the clock pulse generator,
        a comparator connected downstream of the integrator and comparing an integrator output signal with a threshold value, wherein an output signal of the comparator, which depends on the comparison result, is fed back as a control signal ($S_Z$) to the inverter and to the reference voltage source, and
        a time measurer determining durations of measured intervals ($T_m$) during which the working level of the reference signal ($U_{ref}$) is applied to the integrator, as a basis of the measure for the input signal,
        wherein the switchable reference voltage source is synchronized with the inverter via the control signal ($S_Z$), which is fed back in order to pre-determine the polarity-reversal clock pulse, and wherein the reference signal ($U_{ref}$) is bipolar with the polarity-reversal clock pulse.

2. The device as claimed in claim 1, wherein the comparator determines the time point of each crossing of the threshold value by the integrator output signal, and further comprising a controller feeding back the comparator output signal, said controller controlling the switchable inverter, depending on the crossing time point determined, to make a polarity change in the intermediate signal ($U_Z$) and controlling the switchable reference voltage source to disconnect the working level of the reference signal ($U_{ref}$) from the integrator.

3. The device as claimed in claim 2, wherein the controller also controls the switchable reference voltage source, following each disconnection of the working level of the reference signal ($U_{ref}$) from the integrator, for renewed application of the working level of the reference signal ($U_{ref}$) to the integrator after a pre-determined time interval ($T_C$).

4. The device as claimed in claim 3, wherein the overall duration between two successive polarity changes in the intermediate signal ($U_Z$) is used as the basis of the measure for the input signal ($U_E$).

5. The device as claimed in claim 2, wherein the controller also controls the switchable reference voltage source after a fixed time interval ($T_T$) following a respective preceding application of the working level of the reference signal ($U_{ref}$) to the integrator, for renewed application of the working level of the reference signal ($U_{ref}$) to the integrator.

6. The device as claimed in claim 1, further comprising: an adder totaling an even number of measured interval durations, and an output outputting an output value based on the totaled value as the measure for the input signal.

7. The device as claimed in claim 6, wherein the adder bases a current determination of the totaled value on the sequence of measured interval durations on which a preceding determination was based, without a pre-determined number of durations of oldest measured intervals and additionally with the same number of durations of newest measured intervals that were not taken into account in the preceding determination.

8. A measurement amplification method for detecting a monopolar input signal ($U_E$) and for generating a digital output value as a measure for the input signal ($U_E$), comprising:
converting the input signal ($U_E$) with a switchable inverter which is controlled by a clock pulse generator with a polarity-reversal clock pulse, into a bipolar intermediate signal ($U_Z$) with the polarity-reversal clock pulse, and
generating the digital output value with an A/D converter in accordance with the intermediate signal ($U_Z$), wherein
during operation, the intermediate signal ($U_Z$) is applied continuously, and a working level of a bipolar reference signal ($U_{ref}$) is applied intermittently to an integrator of the A/D converter for repetitive integration, the reference signal originating from a switchable reference voltage source controlled by the clock pulse generator,
an integrator output signal is compared with a threshold value by a comparator connected downstream of the integrator, wherein a comparator output signal which depends on the comparison result is fed back as a control signal ($S_Z$) to the inverter and the reference voltage source,
the durations of measured intervals ($T_m$) during which the working level of the reference signal ($U_{ref}$) is applied to the integrator are determined as a basis of the measure for the input signal,
the switchable reference voltage source is synchronized with the inverter by the control signal ($S_Z$), which is fed back to pre-determine the polarity-reversal clock pulse, so that the reference signal ($U_{ref}$) is bipolar with the polarity-reversal clock pulse.

9. The method as claimed in claim 8, wherein, on comparison of the integrator output signal with a threshold value, the time point at which the integrator output signal crosses the threshold value is detected, and the polarity change of the intermediate signal ($U_Z$) and the disconnection of the working level of the reference signal ($U_{ref}$) from the integrator (18, 20) are carried out in accordance with the detected time point.

10. The method as claimed in claim 8, wherein, following each disconnection of the working level of the reference signal ($U_{ref}$) from the integrator, the working level of the reference signal ($U_{ref}$) is applied again to the integrator after a pre-determined time interval ($T_C$).

11. The method as claimed in claim 10, wherein the overall duration ($T_T$) between two successive polarity changes in the intermediate signal ($U_Z$) is used as the basis of the measure for the input signal ($U_E$).

12. The method as claimed in claim 9, wherein, following a respective preceding application of the working level of the reference signal ($U_{ref}$) to the integrator, the working level of the reference signal ($U_{ref}$) is applied again to the integrator after a fixed time interval ($T_T$).

13. The method as claimed in claim 8, wherein an even number of successive measured interval durations are totaled and the measure for the input signal is output based on the totaled value.

14. The method as claimed in claim 13, wherein a current determination of the totaled value is based on the sequence of measured interval durations on which a preceding determination was based, without a pre-determined number of durations of oldest measured intervals and additionally with the same number of durations of newest measured intervals that were not taken into account in the preceding determination.

* * * * *